United States Patent
Ross et al.

(10) Patent No.: US 11,301,403 B2
(45) Date of Patent: Apr. 12, 2022

(54) COMMAND BUS IN MEMORY

(71) Applicant: Micron Technology, Inc., Boise, ID (US)

(72) Inventors: Frank F. Ross, Boise, ID (US); Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 16/289,967

(22) Filed: Mar. 1, 2019

(65) Prior Publication Data
US 2020/0278940 A1  Sep. 3, 2020

(51) Int. Cl.
*G06F 13/16* (2006.01)
*G06F 3/06* (2006.01)
*G11C 5/04* (2006.01)

(52) U.S. Cl.
CPC ........ *G06F 13/1694* (2013.01); *G06F 3/0659* (2013.01); *G11C 5/04* (2013.01)

(58) Field of Classification Search
None
See application file for complete search history.

(56) References Cited

U.S. PATENT DOCUMENTS

| | | | | |
|---|---|---|---|---|
| 5,740,400 | A | * | 4/1998 | Bowles ............... G06F 12/0811 711/144 |
| 6,948,031 | B2 | | 9/2005 | Chilton |
| 7,451,263 | B2 | | 11/2008 | Oh et al. |
| 2002/0056028 | A1 | * | 5/2002 | Chang ................ G06F 12/0804 711/143 |
| 2005/0132136 | A1 | * | 6/2005 | Inoue ................. G06F 12/0866 711/114 |
| 2005/0169061 | A1 | | 8/2005 | Sohn et al. |
| 2009/0046533 | A1 | | 2/2009 | Jo |
| 2015/0149789 | A1 | * | 5/2015 | Seo ...................... G06F 3/0608 713/193 |
| 2017/0075576 | A1 | * | 3/2017 | Cho ........................ G11C 5/04 |

(Continued)

FOREIGN PATENT DOCUMENTS

KR   1020180044635   5/2018

OTHER PUBLICATIONS

Search Report and Written Opinion for related PCT Application No. PCT/US2020/020008, dated Jun. 19, 2020, 13 pages.

*Primary Examiner* — Charles J Choi
(74) *Attorney, Agent, or Firm* — Brooks, Cameron & Huebsch, PLLC

(57) ABSTRACT

The present disclosure includes apparatuses and methods related to a command bus in memory. A memory module may be equipped with multiple memory media types that are responsive to perform various operations in response to a common command. The operations may be carried out during the same clock cycle in response to the command. An example apparatus can include a first number of memory devices coupled to a host via a first number of ports and a second number of memory devices each coupled to the first number of memory devices via a second number of ports, wherein the second number of memory devices each include a controller, and wherein the first number of memory devices and the second number of memory devices can receive a command from the host to perform the various (e.g., the same or different) operations, sometime concurrently.

20 Claims, 6 Drawing Sheets

FIG. 2B

(56) References Cited

U.S. PATENT DOCUMENTS

| | | | |
|---|---|---|---|
| 2017/0206036 A1* | 7/2017 | Pax | G11C 7/10 |
| 2017/0235522 A1* | 8/2017 | Kim | G06F 11/1064 |
| | | | 714/773 |
| 2017/0242593 A1 | 8/2017 | Riley et al. | |
| 2017/0371776 A1 | 12/2017 | Riley et al. | |
| 2018/0004422 A1 | 1/2018 | Riley et al. | |
| 2018/0113629 A1 | 4/2018 | Kim et al. | |
| 2018/0181494 A1 | 6/2018 | Malladi et al. | |
| 2018/0246643 A1 | 8/2018 | Jenne et al. | |
| 2018/0246790 A1 | 8/2018 | Sankaranarayanan et al. | |
| 2020/0133565 A1* | 4/2020 | Kim | G06F 3/0656 |

* cited by examiner

COMMAND BUS IN MEMORY

TECHNICAL FIELD

The present disclosure relates generally to memory devices, and more particularly, to apparatuses and methods using a command bus in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be uses as main memory in computing systems.

DETAILED DESCRIPTION

Figure 1A:
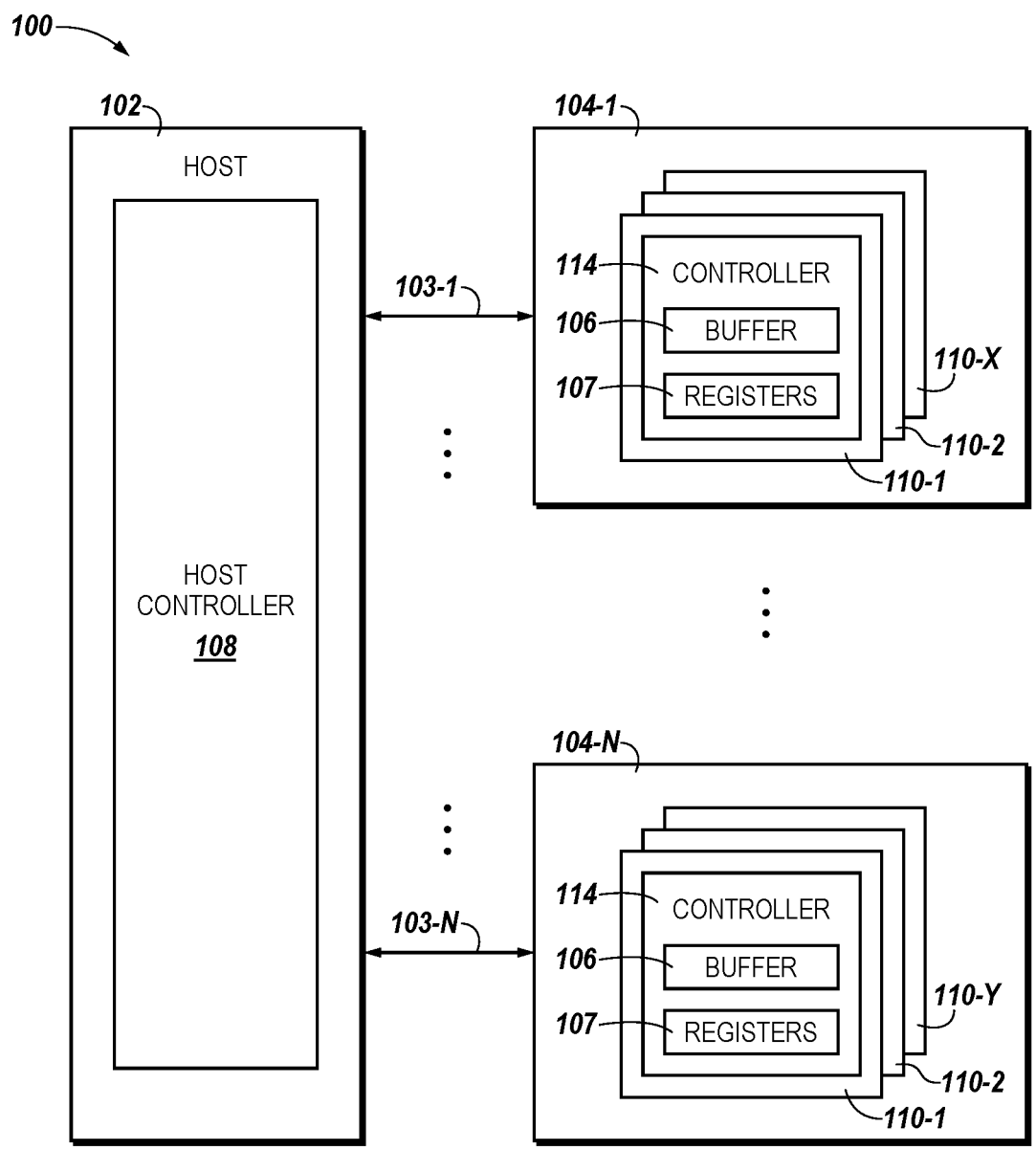
FIG. 1A is a block diagram of an apparatus in the form of a computing system including a memory system in accordance with a number of embodiments of the present disclosure.

The present disclosure includes apparatuses and methods related to a command bus in memory. A memory module may be equipped with multiple memory media types that are responsive to perform various operations in response to a common command. The operations may be carried out during the same clock cycle in response to the command. An example apparatus can include a first number of memory devices coupled to a host via a first number of ports and a second number of memory devices coupled to the first number of memory devices via a second number of ports, wherein the second number of memory devices each include a controller, and wherein the first number of memory devices and the second number of memory devices receive a command from the host and the first number of memory devices perform a first operation and the second number of memory devices perform a second operation.

In a number of embodiments, a first number of memory devices can each include a controller and a second number of memory devices can each include a controller. The controllers of the second number of memory devices can be configured to receive a command from the host and execute operations on the second number of memory devices based on the command from the host. For example, the controllers of the second number of memory devices can receive a command from the host including instructions to transfer data from the first number of memory devices to the second number of memory devices. Based on the command from the host, the controllers of the second number of memory devices can generate instructions for execution by the second number of memory devices to write data received from the first number of memory devices to the second number of memory devices. In some examples, the write can include receiving data from the first number of memory devices and writing the data from the first number of memory devices.

In some examples, the first number of memory devices can each include a controller. The controllers of the first number of memory devices can be configured to receive commands from the host and execute operations on the first number of memory devices based on the command from the host. For example, the controllers of the first number of memory devices can receive the same command as the controllers of the second number of memory devices including the instructions to transfer data from the first number of memory devices to the second number of memory devices; however, the controllers of the first number of memory devices can generate different instructions based on the same command from the host than the controller of the second number of memory devices. For example, the controllers of the first number of memory devices can generate instructions for execution by the first number of memory devices to read data from the first number of memory devices. In some examples, the read can include reading data from the first number of memory devices and sending the data to the second number of memory devices.

A memory system can include a dual in-line memory module (DIMM) having a number of memory devices. For example, a DIMM can be a non-volatile DIMM (NVDIMM) that includes a number of types of memory mediums and/or media, including a number of volatile memory devices and a number of non-volatile memory devices. A DIMM can execute commands to transfer data between the host and the volatile memory device, between the host and the non-volatile memory device, between the volatile and non-volatile memory devices, between non-volatile memory devices, and between volatile memory devices. The commands can be received by the DIMM from another device, such as a host, and/or can be generated by a controller on the DIMM.

For example, the number of volatile memory devices can be coupled to another device, such as a host, via a first port (e.g., an A Side Port) and be coupled to a number of non-volatile memory devices on the DIMM via a second port (e.g., a B Side Port). The DIMM can execute commands to transfer data between another device, such as a host, and the volatile memory devices via an A Side Port and the DIMM can execute commands to transfer data between the volatile memory devices and the non-volatile memory devices via a B Side Port. The DIMM can execute the commands to transfer data between another device and the volatile memory devices while executing the commands to transfer data between the volatile memory device and the non-volatile memory devices.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1A is a functional block diagram of a computing system 100 including an apparatus in the form of a number of memory systems 104-1 . . . 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1A, memory systems 104-1 . . . 104-N can include a one or more dual in-line memory modules (DIMM) 110-1, . . . 110-X, 110-Y. The DIMMs 110-1, . . . 110-X, 110-Y can include volatile memory and/or non-volatile memory. In a number of embodiments, memory systems 104-1, . . . , 104-N can include a multi-chip device. A multi-chip device can include a number of different memory types and/or memory modules. For example, a memory system can include non-volatile or volatile memory on any type of a module. The examples described below in association with FIGS. 1A-5 use a DIMM as the memory module, but the embodiments of the present disclosure can be used on any memory system that include volatile and/or non-volatile memory. In this example, each DIMM 110-1, . . . 110-X, 110-Y includes memory devices 121 and 124. In some examples, memory device 121 can be a DRAM device and memory device 124 can be a non-volatile memory device. The memory device 121 can include controller 116 and memory device 124 can include controller 114. Controllers 114 and 116 can receive commands from host 102 and control execution of the commands on the memory devices 121 and 124. The host 102 can send commands to the DIMMs 110-1, . . . 110-X, 110-Y using the protocol of the present disclosure and/or a prior protocol, depending on the type of memory in the DIMM. For example, the host can use the protocol of the present disclosure to communicate on the same channel (e.g., channel 103-1) with a NVDIMM and a prior protocol to communicate with a DRAM DIMM that are both on the same memory system 104.

As illustrated in FIG. 1A, a host 102 can be coupled to the memory systems 104-1 . . . 104-N. In a number of embodiments, each memory system 104-1 . . . 104-N can be coupled to host 102 via a channel (e.g., channels 103-1, . . . , 103-N). In FIG. 1A, memory system 104-1 is coupled to host 102 via channel 103-1 and memory system 104-N is coupled to host 102 via channel 103-N. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory systems 104-1 . . . 104-N. The host controller 108 can send commands to the DIMMs 110-1, . . . 110-X, 110-Y via channels 103-1 . . . 103-N. The host controller 108 can communicate with the DIMMs 110-1, . . . 110-X, 110-Y and/or the memory devices 121 and 124 on each of the DIMMs 110-1, . . . 110-X, 110-Y to read, write, and erase data, among other operations. A physical host interface of host 102 can provide an interface for passing control, address, data, and other signals between the memory systems 104-1 . . . 104-N and host 102 having compatible receptors for the physical host interface. The signals can be communicated between host 102 and DIMMs 110-1, . . . 110-X, 110-Y on a number of buses, such as a data bus and/or an address bus, for example, via channels 103-1 . . . 103-N.

The host controller 108 and/or controllers 114 and 116 on a DIMM can include control circuitry, e.g., hardware, firmware, and/or software. In one or more embodiments, the host controller 108 and/or controllers 114 and 116 can be an application specific integrated circuit (ASIC) and/or a field programmable gate array (FPGA) coupled to a printed circuit board including a physical interface. Also, each DIMM 110-1, . . . 110-X, 110-Y can include buffers of volatile and/or non-volatile memory and registers. A buffer can be used to buffer data that is used during execution of commands.

The DIMMs 110-1, . . . 110-X, 110-Y can provide main memory for the memory system or could be used as additional memory or storage throughout the memory system. Each DIMM 110-1, . . . 110-X, 110-Y can include one or more arrays of memory cells on memory dies, e.g., volatile and/or non-volatile memory cells. The arrays can be flash arrays with a NAND architecture, for example. Embodiments are not limited to a particular type of memory device.

For instance, the memory device can include RAM, ROM, DRAM, SDRAM, PCRAM, RRAM, and flash memory, among others.

The embodiment of FIG. 1A can include additional circuitry that is not illustrated so as not to obscure embodiments of the present disclosure. For example, the memory systems 104-1 . . . 104-N can include address circuitry to latch address signals provided over I/O connections through I/O circuitry. Address signals can be received and decoded by a row decoder and a column decoder to access the DIMMs 110-1, . . . 110-X, 110-Y. It will be appreciated by those skilled in the art that the number of address input connections can depend on the density and architecture of the DIMMs 110-1, . . . 110-X, 110-Y.

Figure 1B:
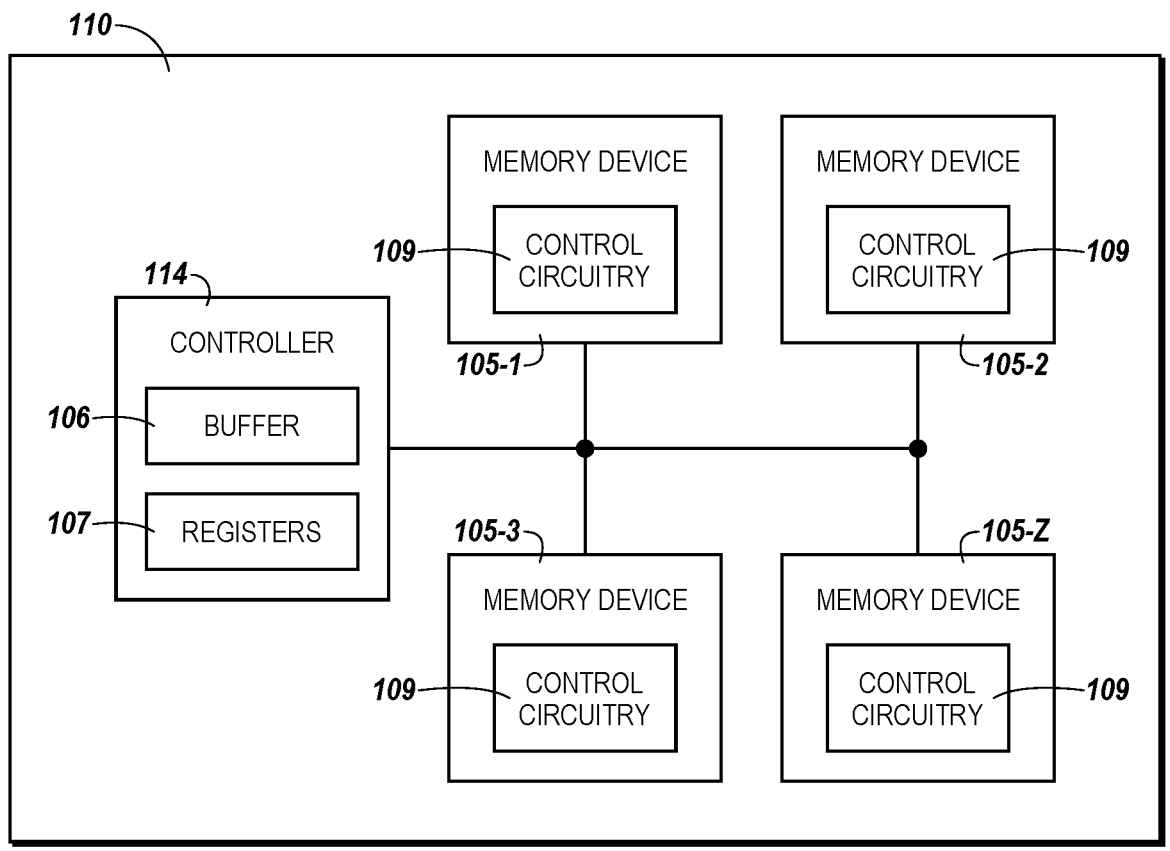
FIG. 1B is a block diagram of an apparatus in the form of a dual in-line memory modules (DIMM) in accordance with a number of embodiments of the present disclosure.

FIG. 1B is a block diagram of an apparatus in the form of a dual in-line memory modules (DIMM) 110 in accordance with a number of embodiments of the present disclosure. In FIG. 1B, DIMM 110 can include memory devices 121-1, 121-2, 124-1, 124-2. Memory devices 121-1, 121-2 can include controllers 116-1, 116-2 and memory devices 124-1, 124-2 can include controllers 114-1, 114-2. Memory devices 1241-1, 121-2 can be DRAM devices and memory devices 124-1, 124-2 can be non-volatile memory devices, for example. Memory devices 121-1, 121-2, 124-1, 124-2 can include control circuitry (e.g., hardware, firmware, and/or software) which can be used to execute commands on the memory devices 121-1, 121-2, 124-1, 124-2. The control circuitry can receive instructions from controllers 114-1, 114-2, 116-1, 116-2. The control circuitry can be configured to execute commands to read and/or write data in the memory devices 121-1, 121-2, 124-1, 124-2.

Figure 2A:
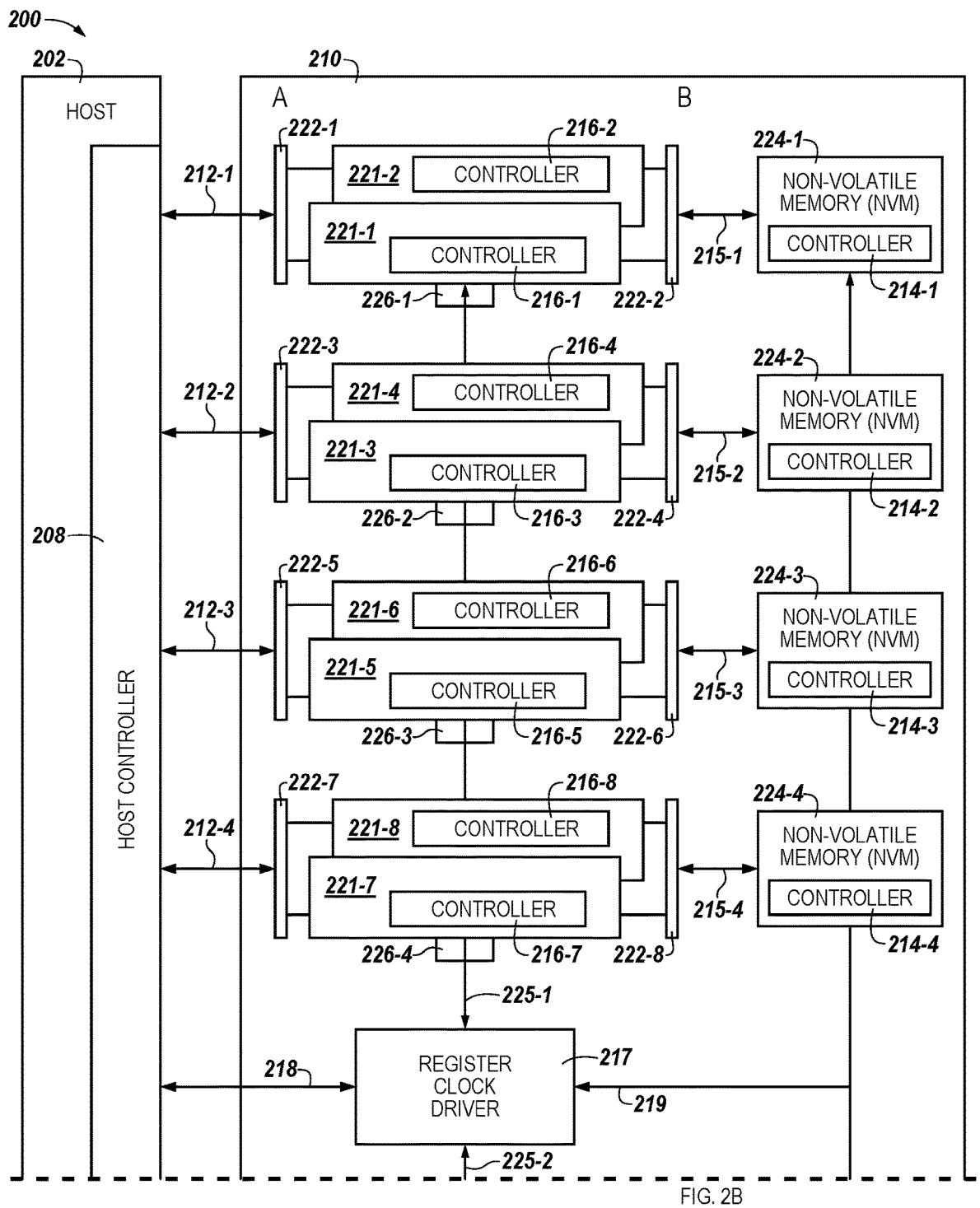
FIGS. 2A and 2B are a block diagram of a computing system including a host and a memory system comprising a dual in-line memory module (DIMM) with ports in accordance with a number of embodiments of the present disclosure.
Figure 2B:
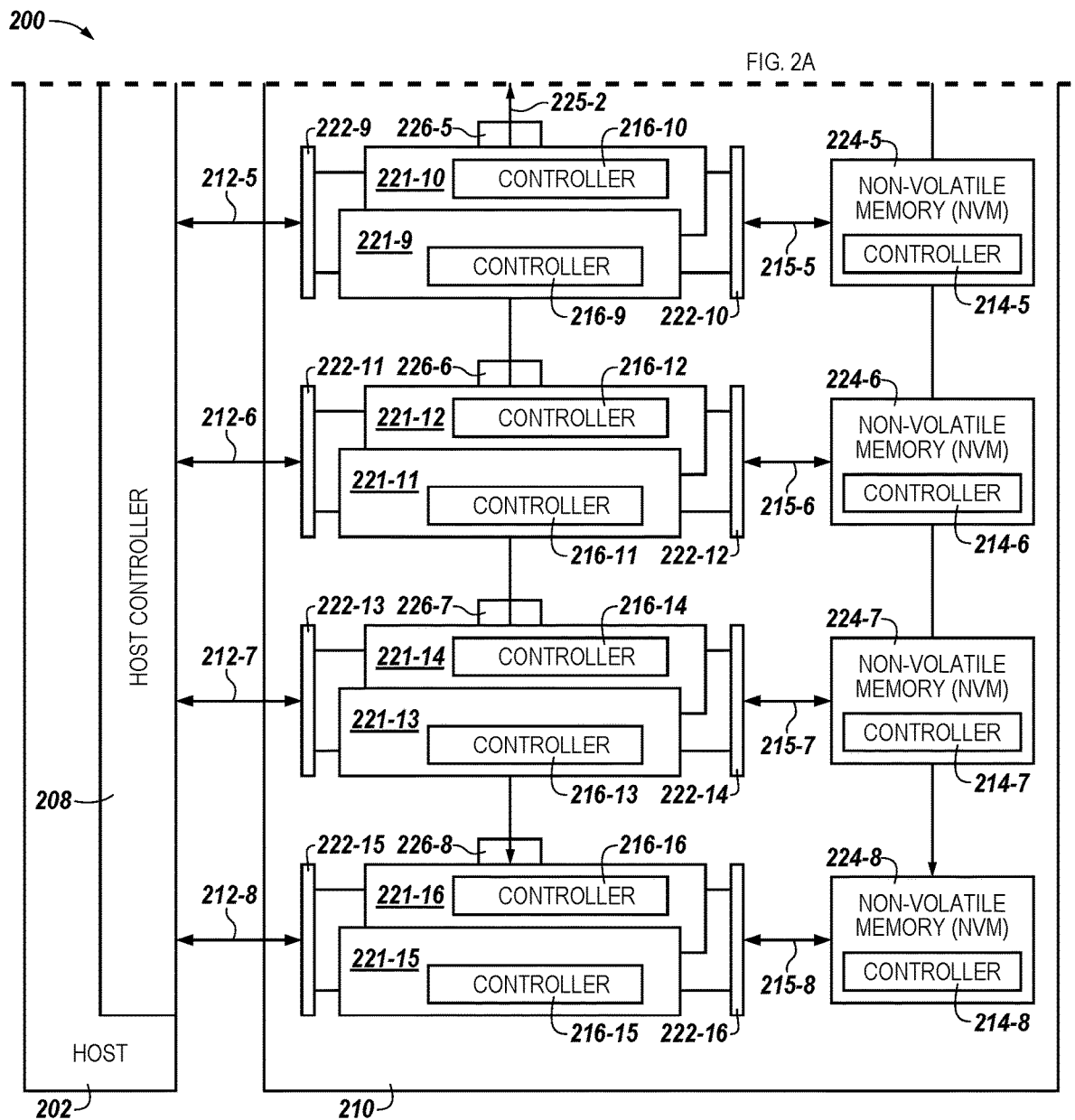

FIGS. 2A and 2B area block diagram of a computing system 200 including a host 202 and a memory system comprising a dual in-line memory module (DIMM) 210 with ports in accordance with a number of embodiments of the present disclosure. In FIGS. 2A and 2B, host 202 is coupled to DIMM 210 via data buses 212-1, . . . , 212-8 and command/address bus 218. Host 202 can be coupled to DIMM 210 via a number of channels (e.g., channels 103-1, . . . , 103-N in FIG. 1A). For example, host 202 is coupled to DIMM 210 via a first channel that includes data buses 212-1, . . . , 212-4 and command/address bus 218 and host 202 is coupled to DIMM 210 via a second channel that includes data buses 212-5, . . . , 212-8 and command address/bus 218. Host 202 can send commands on the first channel for execution on memory devices 221-1, . . . , 221-8 and memory devices 224-1, . . . , 224-4 and can send commands on the second channel for execution on memory devices 221-9, . . . , 221-16 and memory devices 224-5, . . . , 224-8. The memory devices 224-1, . . . , 224-8 can include controllers 214-1, . . . , 214-8. Controllers 214-1, . . . , 214-8 can receive commands directly from host 202 via command bus 218, 219. The commands from host 202 can be to read and/or write data to DIMM 210, for example. Controllers 214-1, . . . , 214-8 can interpret the command from host 202 by generating instructions to read data from and/or write data to memory devices 224-1, . . . , 224-8 to read, write, and transfer data on DIMM 210. The commands from host 202 can be sent to register clock driver (RCD) 217 via bus 218 and the commands can be sent from RCD 217 to controllers 214-1, . . . , 214-8 via bus 219. The controllers 214-1, . . . , 214-8 can receive the commands from RCD 217 and store data associated with the commands (e.g., command instructions and/or data read from and/or to be written to memory devices 224-1, . . . , 224-8 during execution of the commands) in a buffer.

The memory devices 221-1, . . . , 221-16 can include controllers 216-1, . . . , 216-16. Host 202 can send commands to memory devices 221-1, . . . , 221-8 on command bus 225-1, 219 and/or RCD 217. Host 202 can send commands to memory devices 221-9, . . . , 221-16 on command bus 225-2, 219 and/or RCD 217. The instructions from controllers 216-1, . . . , 216-16 can include performing read operations to read data on memory devices 221-1, . . . , 221-16 and send the data to memory devices 224-1, . . . , 224-8 on buses 215-1, . . . , 215-8 and/or send the data to host 202 on buses 212-1, . . . 212-8. The instructions from controllers 216-1, . . . , 216-16 can include performing write operations to write data to memory devices 221-1, . . . , 221-16 that is received from memory devices 224-1, . . . , 221-8 on buses 215-1, . . . , 215-8 and/or write data to memory devices 221-1, . . . , 221-16 that is received from host 202 on buses 212-1, . . . , 212-8. The instructions can be generated and/or executed in response to receiving a command from host 202.

Host 202 can send a signal to RCD 217 indicating which memory device of a pair of memory devices (e.g., memory device 221-1 or 221-2, for example) will execute the command. The signal can be sent from RCD 217 to multiplexor 226-1, . . . , 226-8 and cause multiplexor 226-1, . . . , 226-8 to select a memory device from a pair of memory devices and couple the selected memory device to RCD 217 via bus 225-1 and/or 225-2. For example, if the command is transferring data via an A side port and the A side port is coupling memory device 221-1 to host 202, while the B side port is coupling memory device 221-2 to memory device 224-1, the signal can indicate to multiplexor 226-1 to couple bus 225-1 to memory device 221-1. The host controller 208 can then send the command to the controller 216-1 of memory device 221-1. The controller 216-1 can generate and execute instructions to transfer data between memory device 221-1 and host 202. Memory devices 221-1, . . . , 221-16 can send signals, (e.g., command completion signals) on buses 225-1 and 225-2 to RCD 217 and controller 214 that indicate memory devices 221-1, . . . , 221-16 have completed execution of commands and are ready for additional commands. Once a command has been executed, controllers 216-1, . . . , 216-16 can send instructions to RCE 217 for execution and/or a status signal to the host 202 indicating that the command received from host 202 has been executed. Controllers 216-1, . . . , 216-16 can include non-volatile and/or volatile memory, such as SRAM memory, that can be a buffer and/or a register used during execution of commands.

Host controller 208 can send commands to memory devices 224-1, . . . , 224-8 on buses 218 and 219. The controllers 214-1, . . . , 214-8 can receive the commands from host controller 208. The controllers 214-1, . . . , 214-8 can generate and execute instructions based on the command from the host controller 208. The instructions can include performing read operations to read data from memory devices 224-1, . . . , 224-8 and send the data directly to memory devices 221-1, . . . , 221-16 on buses 215-1, . . . , 215-8. The instructions from controllers 214-1, . . . , 214-8 can include performing write operations to write data to memory devices 224-1, . . . , 224-8 received from memory devices 221-1, . . . , 221-16 directly via buses 215-1, . . . , 215-8. Memory devices 224-1, . . . , 224-8 can include buffers to temporarily store data received from memory devices 221-1, . . . , 221-16 when writing the data to memory devices 224-1, . . . , 224-8.

Controllers 214-1, . . . , 214-8 and controllers 216-1, . . . , 216-16 can generate instructions for performing read and/or write operations on memory devices 224-1, ..., 224-8 and 221-1, ..., 221-16 with timing such that the memory devices 224-1, ..., 224-8 and 221-1, ..., 221-16 can execute a write operation without latency after completion of a read operation. For example, controller 214-1 can generate instructions for performing a read operation on memory device 224-1. Memory device 224-1 can execute the read operation and send the data associated with the read operation to memory device 221-1 on bus 215-1. Controller 216-1 can generate instructions for performing a write operation on memory device 221-1 at a time such that the memory device 221-1 can execute the write operation without latency and as memory device 221-1 is receiving the data from memory device 224-1 on bus 215-1. Memory device 221-1 can execute the write operation from controller 216-1 with timing such that memory device 221-1 can begin execution of the write operation in a clock cycle that occurs immediately following completion of the read operation and receipt of the data from memory device 224-1.

DIMM 210 can include a first number of memory devices 221-1, ..., 221-16. For example, memory devices 221-1, ..., 221-16 can be DRAM memory devices, among other types of volatile and/or non-volatile memory. The memory devices 221-1, ..., 221-16 can be paired together. For example, memory devices 221-1 and 221-2 are paired together, coupled to the host via port 222-1 (A Side Port) and buses 212-1 and 212-2, and coupled to memory device 224-1 via port 222-2 (B Side Port) and bus 215-1. Memory devices 221-3 and 221-4 are paired together, coupled to the host via port 222-3 (A Side Port) and bus 212-2, and coupled to memory device 224-2 via port 222-4 (B Side Port) and bus 215-2. Memory devices 221-5 and 221-6 are paired together, coupled to the host via port 222-5 (A Side Port) and bus 212-3, and coupled to memory device 224-3 via port 222-6 (B Side Port) and bus 215-3. Memory devices 221-7 and 221-8 are paired together, coupled to the host via port 222-7 (A Side Port) and bus 212-4, and coupled to memory device 224-4 via port 222-8 (B Side Port) and bus 215-4. Memory devices 221-9 and 221-10 are paired together, coupled to the host via port 222-9 (A Side Port) and bus 212-5, and coupled to memory device 224-5 via port 222-10 (B Side Port) and bus 215-5. Memory devices 221-11 and 221-12 are paired together, coupled to the host via port 222-11 (A Side Port) and bus 212-6, and coupled to memory device 224-6 via port 222-12 (B Side Port) and bus 215-6. Memory devices 221-13 and 221-14 are paired together, coupled to the host via port 222-13 (A Side Port) and bus 212-7, and coupled to memory device 224-7 via port 222-14 (B Side Port) and bus 215-7. Memory devices 221-15 and 221-16 are paired together, coupled to the host via port 222-15 (A Side Port) and bus 212-8, and coupled to memory device 224-8 via port 222-16 (B Side Port) and bus 215-8.

DIMM 210 can include a second number of memory devices 224-1, ..., 224-8. For example, memory devices 224-1, ..., 224-8 can be 3D XPoint memory devices, among other types of volatile and/or non-volatile memory.

Memory system 200 can be configured to execute commands sent from host 202 to DIMM 210 by sending command/address information from the host controller 208 on command/address busses 218 and 219 via the register clock driver (RCD) 217 and data on data buses 212-1, ..., 212-8. The commands from the host can include address information for memory devices 221-1, ... 221-16 where the host is requesting an operation on data at a particular location in memory devices 221-1, ... 221-16. The commands from the host can include address information for memory devices 224-1, ..., 224-8 where the host is requesting an operation on data at particular location in memory devices 224-1, ..., 224-8, while memory devices 221-1, ... 221-16 can act as a buffer during execution of the commands.

In a number of embodiments, memory devices 221-1, ... 221-16 can be configured as cache. For example, memory devices can be configured as cache for the data stored in memory devices 224-1, ..., 224-8 and/or other memory devices coupled to the computing system. The DIMM 210 can be configured to have a portion of memory devices 221-1, ... 221-16 addressable by host 202 and a portion of the memory devices 221-1, ... 221-16 configured as cache.

DIMM 210 includes memory devices that are paired together and one of the paired memory devices can be selected for coupling to host 202 via an A Side Port and the other of the paired memory device can be selected for coupling to another memory device via a B Side Port. For example, memory devices 221-1, which is paired with memory device 221-2, can be selected for coupling to host 202 via port 222-1, while memory device 221-2 can be selected for coupling to memory device 224-1 via port 222-2. Port 222-1 can include a multiplexor to select and couple memory device 221-1 to host 202 while isolating memory device 221-2 from host 202. Port 222-2 can include a multiplexor to select and couple memory device 221-2 to memory device 224-1 while isolating memory device 221-1 from memory device 224-1. Host 202 can send command to DIMM 210 for execution on the selected A Side Port memory device (e.g., memory device 221-1). The commands can be executed by transferring data between host 202 and memory device 221-1 via port 222-1 on buses 212-1 and/or 212-2. DIMM 210 can also execute commands for execution on the selected B Side Port memory device (e.g., memory device 221-2). The commands can be executed by transferring data between memory device 221-2 and memory device 224-1 on buses 215-1. Commands executed using the B Side Port can transfer data between memory devices 221-1, ..., 221-16 and memory devices 224-1, ..., 224-8. Ports 222-1, ..., 222-16 can be external to memory devices 221-1, ..., 221-16 as illustrated in FIGS. 2A and 2B and/or internal to memory devices 221-1, ..., 221-16.

In a number of embodiments, commands that transfer data via the A Side Ports can be executed while commands that transfer data via the B Side Ports. The data that is stored in pairs memory devices can be arbitrated and reconciled by the controller. Memory devices that have executed commands where data was transferred to and/or from one of the memory devices on the A Side Port and to and/or from the other paired memory device on the B Side Port can have the data on the pair of memory device reconciled by transferring data between the pair of memory devices and/or between the pair of memory devices and memory devices 224-1, ..., 224-8. For example, after A Side Port and B Side Port transfers have occurred on a pair of memory devices and DIMM 210 is idle, controllers 214-1, ..., 214-8 and/or controllers 216-1, ..., 216-16 can send instructions to reconcile the data stored on the pair of memory devices so that the same data is stored on each of the memory devices by transferring data between the pair of memory devices and/or between the pair of memory devices and memory devices 224-1, ..., 224-8.

In a number of embodiments, commands can be received from host 202 and instructions can be generated by controllers 214-1, ..., 214-8, based on the commands from the host, to transfer data between memory devices 224-1, ..., 224-8. Data can be transferred between memory devices 224-1, ..., 224-8 via controllers 214-1, ..., 214-8 using buffers and/or registers on or coupled to the controllers 214-1, ..., 214-8.

In a number of embodiments, memory devices 221-1, ..., 221-16 can be a first number of memory devices and memory devices 224-1, ..., 224-8 can be a second number of memory devices. As described above, the first number of memory devices can be coupled to host 202 via a first number of side ports 222-1, 222-3, 222-5, 222-7, 222-9, 222-11, 222-13, and 222-15 (e.g., A side ports). The second number of memory devices 224-1, ..., 224-8 can be coupled to the first number of memory devices 221-1, ..., 221-16 via a second number of ports 222-2, 222-4, 222-6, 222-8, 222-10, 222-12, 222-14, and 222-16 (e.g., B side ports).

The second number of memory devices 224-1, ..., 224-8 can each include a controller 214-1, ..., 214-8. The first number of memory devices 221-1, ..., 221-16 and the second number of memory devices 224-1, ..., 224-8 can receive a command from the host 202. In response to receiving the command from the host, the first number of memory devices 221-1, ..., 221-16 can perform a first operation and the second number of memory devices 224-1, ..., 224-8 can perform a second operation.

In some examples, the first operation can include reading data from the first number of memory devices 221-1, ..., 221-16 and/or sending data to the second number of memory devices 224-1, ..., 224-8. The second operation can include writing data to the second number of memory devices 224-1, ..., 224-8, for example.

The command can be sent to the first number of memory devices 221-1, ..., 221-16 and/or the second number of memory devices 224-1, ..., 224-8 via the RCD 217 by the host controller 208 and/or directly from the host controller 208, as described above. The host controller 208 can be configured to send the command to the first number of memory devices 221-1, ..., 221-16 prior to sending the command to the second number of memory devices 224-1, ..., 224-8. In some examples, the controllers 216-1, ..., 216-16 of the first number of memory devices 221-1, ..., 221-16 and the controllers 214-1, ..., 214-8 of the second number of memory devices 224-1, ..., 224-8 can receive the command from the host controller 208 at the same time, but can execute the command at different times.

In a number of embodiments, the controllers 214-1, ..., 214-8 of the second number of memory devices 224-1, ..., 224-8 can be configured to receive the command from the host 202 and generate instructions for the second number of memory devices 224-1, ..., 224-8 based on the command from the host 202. For example, the controllers 214-1, ..., 214-8 of the second number of memory devices 224-1, ..., 224-8 can receive a command from the host 202 to transfer data from the first number of memory devices 221-1, 221-16 to the second number of memory devices 224-1, ..., 224-8. Based on the command from the host 202, the controllers 214-1, ..., 214-8 of the second number of memory devices 224-1, ..., 224-8 can generate instructions for the second number of memory devices 224-1, ..., 224-8 to write the data received from the first number of memory devices 221-1, ..., 221-16 the second number of memory devices 224-1, ..., 224-8.

In some examples, the first number of memory devices 221-1, ..., 221-16 can each include a controller 216-1, ..., 216-16. The controllers 216-1, ..., 216-16 of the first number of memory devices 221-1, ..., 221-16 can be configured to receive the command from the host 202 and generate instructions for the first number of memory devices 221-1, ..., 221-16 based on the command from the host 202. For example, the controllers 216-1, ..., 216-16 of the first number of memory devices 221-1, ..., 221-16 can receive the same command as the controllers 214-1, ..., 214-8 of the second number of memory devices 224-1, ..., 224-8 to transfer data from the first number of memory devices 221-1, ..., 221-16 to the second number of memory devices 224-1, ..., 224-8; however, the controllers 216-1, ..., 216-16 of the first number of memory devices 221-1, ..., 221-16 can generate a instructions based on the same command from the host 202 than the controllers 214-1, ..., 214-8 of the second number of memory devices 224-1, ..., 224-8. For example, the controllers 216-1, ..., 216-16 of the first number of memory devices 221-1, ..., 221-16 can generate instructions for the first number of memory devices 221-1, ..., 221-16 to perform a read operation. The read operation can include reading the data from the first number of memory devices 221-1, ..., 221-16 and sending the data from the first number of memory devices 221-1, ..., 221-16 to the second number of memory devices 224-1, ..., 224-8.

In a number of embodiments, controllers 214-1, ..., 214-8 of the second number of memory devices 224-1, ..., 224-8 can receive a second command from the host 202 to transfer the data from the second number of memory devices 224-1, ..., 224-8 to the host 202. The controllers 214-1, ..., 214-8 of the second number of memory devices 224-1, ..., 224-8 can generate instructions for the second number of memory devices 224-1, ..., 224-8 in response to receiving the second command from the host 202. The instructions can include performing a read operation to read the data from the second number of memory devices 224-1, ..., 224-8 and send the data to the host 202, for example.

Figure 3:
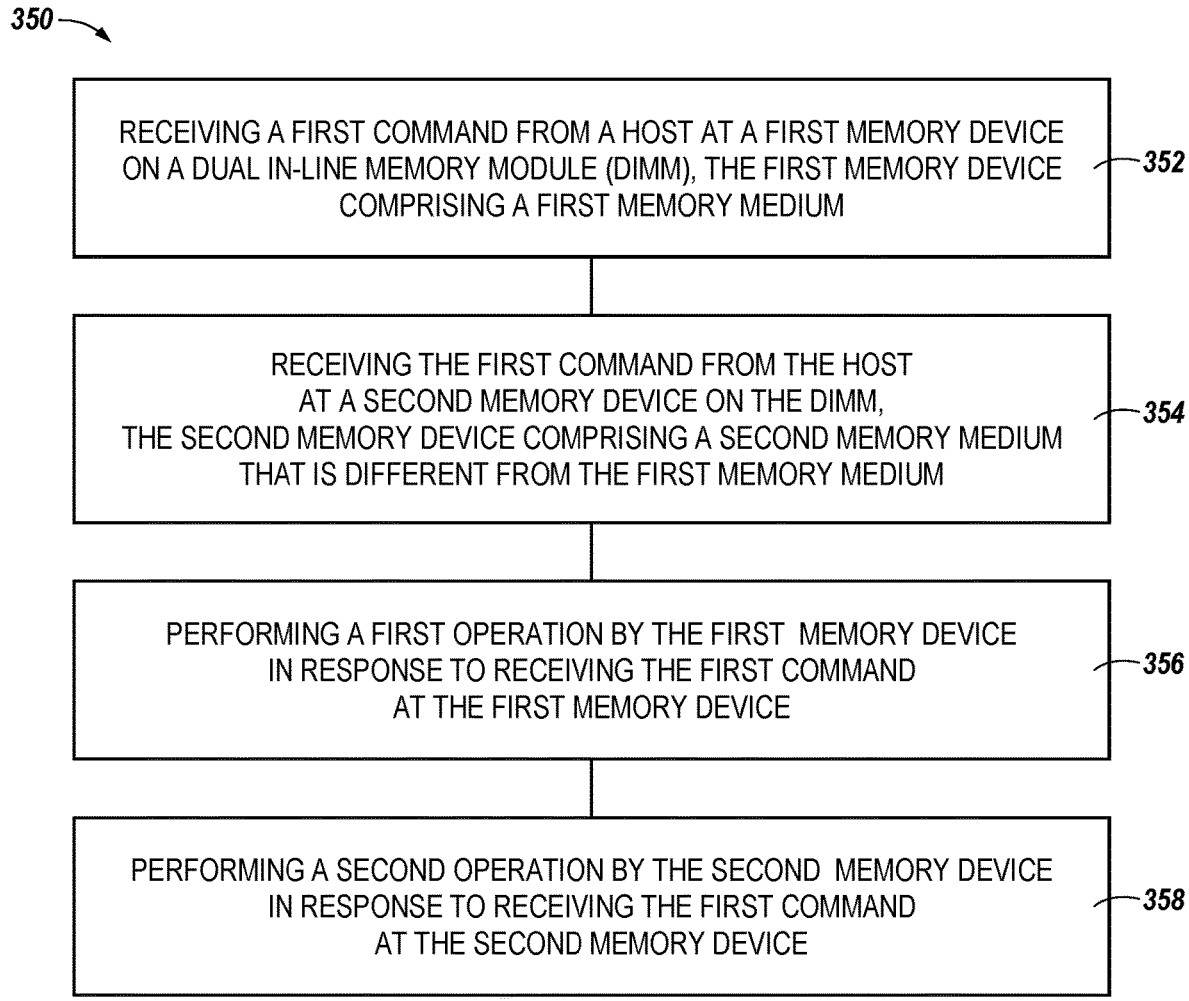
FIG. 3 is a flow diagram illustrating an example memory process including a command bus in memory in accordance with a number of embodiments of the present disclosure.

FIG. 3 is a flow diagram illustrating an example memory process including a command bus in memory in accordance with a number of embodiments of the present disclosure.

At block 352, the method 350 can include receiving a first command from a host at a first memory device on a dual in-line memory module (DIMM), the first memory device comprising a first memory medium.

At block 354, the method 350 can include receiving the first command from the host at a second memory device on the DIMM, the second memory device comprising a second memory medium that is different from the first memory medium.

At block 356, the method 350 can include performing a first operation by the first memory device in response to receiving the first command at the first memory device.

At block 358, the method 350 can include performing a second operation by the second memory device in response to receiving the first command at the second memory device.

Figure 4:
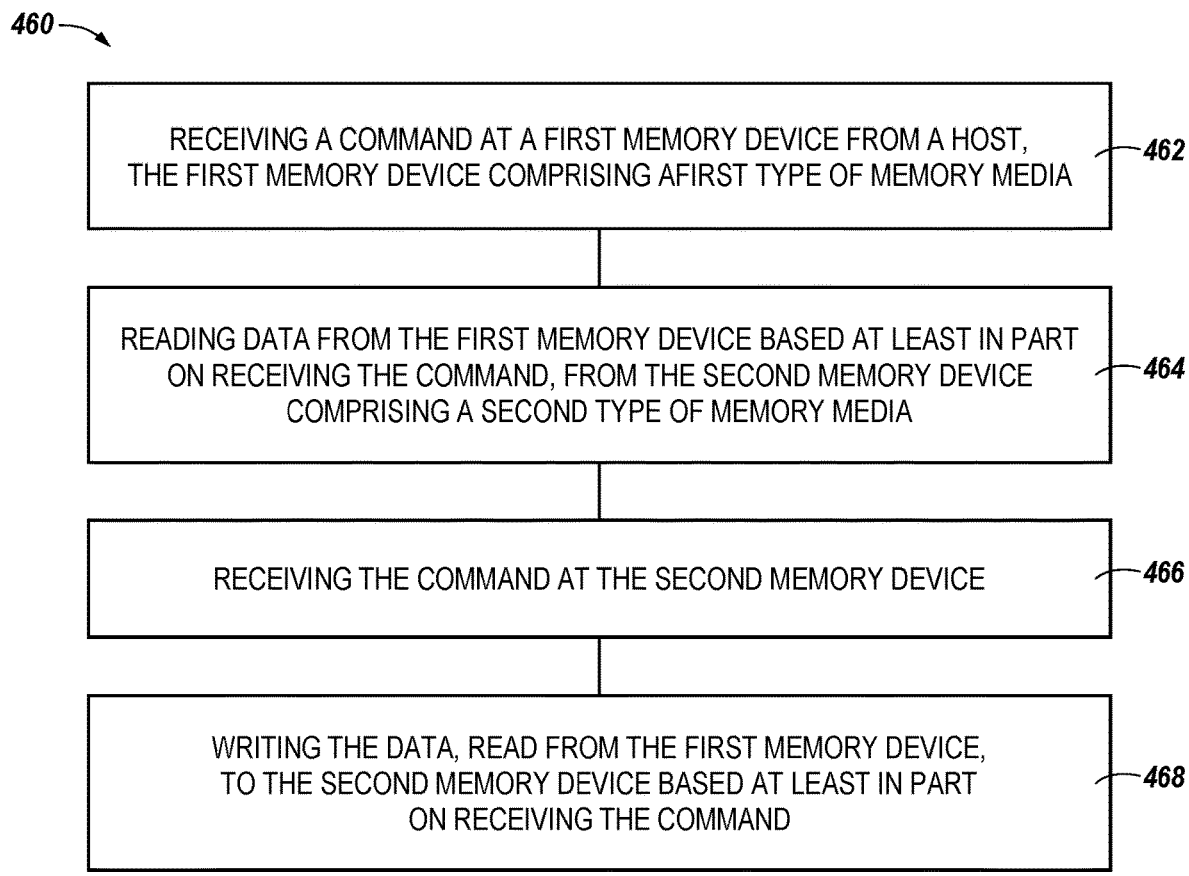
FIG. 4 is a flow diagram illustrating an example memory process including a command bus in memory in accordance with a number of embodiments of the present disclosure.

FIG. 4 is a flow diagram illustrating an example memory process including a command bus in memory in accordance with a number of embodiments of the present disclosure.

At block 462, the method 460 can include receiving a command at a first memory device from a host, the first memory device comprising a first type of memory media.

At block 464, the method 460 can include reading data from the first memory device based at least in part on receiving the command, the second memory device comprising a second type of memory media.

At block 466, the method 460 can include receiving the command at the second memory device.

At block 468, the method 460 can include writing the data, read from the first memory device, to the second memory device based at least in part on receiving the command.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). For the avoidance of doubt, a list of at least one of A, B, or C, or any combination thereof is likewise an inclusive list. Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the foregoing Detailed Description, various features are grouped together in a single embodiment for the purpose of streamlining the disclosure. This method of disclosure is not to be interpreted as reflecting an intention that the disclose 66d embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a first number of memory devices coupled to a host via a first number of ports, wherein a first memory device and a second memory device of the first number of memory devices are directly coupled via a first port of the first number of ports;
   a number of multiplexors coupled to the first number of memory devices and coupled to a command bus; and
   a second number of non-volatile memory devices each coupled to the first number of memory devices via a second number of ports, wherein the second number of memory devices include a controller, and wherein the first number of memory devices are configured to receive a command from the host via the number of multiplexors and the second number of memory devices are configured to receive the command from the host via a register clock driver (RCD) and the first number of memory devices are configured to perform a first operation and the second number of memory devices are configured to perform a second operation in response to the command, wherein the first and second operations are performed using the second number of ports, wherein each port of the second number of ports includes a different multiplexor.

2. The apparatus of claim 1, wherein the first operation includes reading data from the first number of memory devices.

3. The apparatus of claim 1, wherein the first operation includes sending data to the second number of memory devices.

4. The apparatus of claim 1, wherein the second operation includes writing data to the second number of memory devices.

5. The apparatus of claim 1, wherein the RCD is configured to receive the command from the host and transmit the command to the first number of memory devices.

6. The apparatus of claim 1, wherein the second number of memory devices are configured to perform the second operation in response to the first number of memory devices performing the first operation.

7. The apparatus of claim 1, wherein the first number of memory devices are configured to receive the command from the host prior to the second number of memory devices receiving the command.

8. The apparatus of claim 1, wherein the first number of memory devices comprise dynamic random access memory (DRAM) memory.

9. An apparatus, comprising:
   a first memory device coupled to a host interface via a first port, wherein the first memory device and a second memory device are directly coupled via the first port, wherein the first memory device includes a first controller configured to:
      receive a command, via a multiplexor coupled to a command bus, from the host to transfer data from the first memory device to a third memory device via a second port including a different multiplexor; and
      generate instructions for performing a read operation for the first memory device to transfer data from the first memory device to the third memory device; and
   the third memory device coupled to the host interface and the first memory device, wherein the third memory device is a non-volatile memory device, and wherein the third memory device includes a second controller configured to:

receive the command from the host, via a register clock driver (RCD), to transfer data from the first memory device to the third memory device; and generate instructions for performing a write operation for the third memory device to write the data received from the first memory device to the third memory device.

10. The apparatus of claim 9, comprising a memory module configured to transfer data between the first memory device and the host while based at least in part on the command.

11. The apparatus of claim 9, wherein the third memory device is configured to perform the write operation during a clock cycle that immediately follows completion of the read operation.

12. The apparatus of claim 9, configured to transfer data on a bus from the first memory device to the third memory device without interruption by another device or component.

13. The apparatus of claim 9, wherein the second controller is configured to receive a second command, wherein the third memory device is configured to transfer the data from the third memory device to the host in response to receiving the second command.

14. A method, comprising:
receiving a first command, via a multiplexor coupled to a command bus, from a host at a first memory device on a dual in-line memory module (DIMM), wherein the first memory device and a second memory device are directly coupled via a first port, and wherein the first memory device comprises a first memory medium;
receiving the first command from the host at a third memory device on the DIMM, the third memory device comprising a second memory medium that is different from the first memory medium, wherein the third memory device is a non-volatile memory device;
performing a first operation by the first memory device in response to receiving the first command at the first memory device; and
performing a second operation by the third memory device in response to receiving the first command via a register clock driver (RCD) at the third memory device, wherein performing the first and second operations include using a second port including a different multiplexor.

15. The method of claim 14, further comprising:
receiving the first command at a first controller associated with the first memory device; and
generating instructions for the first operation at the first controller in response to receiving the first command from the host.

16. The method of claim 15, wherein the first operation is different from the second operation.

17. The method of claim 15, further comprising:
receiving the first command at a second controller associated with the third memory device; and
generating instructions for the second operation at the second controller in response to receiving the first command from the host.

18. The method of claim 17, wherein the first operation is different from the second operation.

19. The method of claim 14, further comprising:
receiving a second command from the host at the first memory device on the DIMM;
receiving the second command from the host at the third memory device on the DIMM;
performing a third operation by the first memory device in response to receiving the second command; and
performing a fourth operation by the third memory device in response to receiving the second command, wherein the third operation and the fourth operation comprise a same type of operation.

20. A method, comprising:
receiving a command, via a multiplexor coupled to a command bus, at a first memory device from a host, wherein the first memory device and a second memory device are directly coupled via a first port, and wherein the first memory device comprises a first type of memory media;
reading data from the first memory device based at least in part on receiving the command;
receiving the command at a third memory device via a register clock driver (RCD), wherein the third memory device comprises a second type of memory media, and wherein the third memory device is a non-volatile memory device; and
writing the data, read from the first memory device, to the third memory device based at least in part on receiving the command, wherein the data is transmitted from the first memory device to the third memory device via a second port including a different multiplexor.

* * * * *